(12) United States Patent
He

(10) Patent No.: US 8,482,037 B2
(45) Date of Patent: Jul. 9, 2013

(54) GATED ALGAN/GAN SCHOTTKY DEVICE

(75) Inventor: Zhi He, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/609,746

(22) Filed: Sep. 11, 2012

(65) Prior Publication Data
US 2013/0001648 A1    Jan. 3, 2013

Related U.S. Application Data

(63) Continuation of application No. 12/653,097, filed on Dec. 7, 2009, now Pat. No. 8,269,259.

(51) Int. Cl.
*H01L 29/739* (2006.01)

(52) U.S. Cl.
USPC ........... 257/194; 257/183; 257/192; 257/201; 257/E29.246; 257/E33.034

(58) Field of Classification Search
USPC .................. 257/183, 192, 194, 201, E29.246, 257/E33.034
See application file for complete search history.

(56) References Cited

U.S. PATENT DOCUMENTS 7,898,004 B2 * 3/2011 Wu et al. ........................ 257/194

* cited by examiner

*Primary Examiner* — Andy Huynh
(74) *Attorney, Agent, or Firm* — Farjami & Farjami LLP

(57) ABSTRACT

Some exemplary embodiments of a semiconductor device using a III-nitride heterojunction and a novel Schottky structure and related method resulting in such a semiconductor device, suitable for high voltage circuit designs, have been disclosed. One exemplary structure comprises a first layer comprising a first III-nitride material, a second layer comprising a second III-nitride material forming a heterojunction with said first layer to generate a two dimensional electron gas (2DEG) within said first layer, an anode comprising at least a first metal section forming a Schottky contact on a surface of said second layer, a cathode forming an ohmic contact on said surface of said second layer, a field dielectric layer on said surface of said second layer for isolating said anode and said cathode, and an insulating material on said surface of said second layer and in contact with said anode.

20 Claims, 5 Drawing Sheets

GATED ALGAN/GAN SCHOTTKY DEVICE

This is a continuation of application Ser. No. 12/653,097 filed Dec. 7, 2009 now U.S. Pat. No. 8,269,259.

BACKGROUND OF THE INVENTION

1. Field of the Invention

The present invention relates generally to semiconductor devices. More particularly, the present invention relates to semiconductor devices using Schottky structures.

2. Background Art

Diodes with faster reverse recovery times allow for faster switching which enables higher frequency operation. For this reason, Schottky diodes are often desirable since they provide much faster reverse recovery times compared to p-n junctions.

Previously, circuit designs using silicon (Si) based Schottky diodes have been used. However, due to the intrinsic properties of silicon, the maximum reverse bias voltage is limited by breakdown. As a result, silicon based Schottky diodes are limited to voltages of approximately 200V due to low breakdown voltages. To address this issue, the development of gallium nitride (GaN) based Schottky diodes has accelerated, since gallium nitride provides a wider band gap than silicon and supports higher breakdown voltages. Unfortunately, present designs using gallium nitride based Schottky diodes still exhibit excessive reverse leakage current, high forward voltage drop, and/or high fabrication costs.

Thus, a unique cost-effective solution resulting in high breakdown voltage and low reverse leakage current is needed to support the efficient operation of high voltage circuit designs.

SUMMARY OF THE INVENTION

A semiconductor device using a III-nitride heterojunction and a novel gated Schottky structure suitable for high voltage circuit designs, substantially as shown in and/or described in connection with at least one of the figures, as set forth more completely in the claims.

DETAILED DESCRIPTION OF THE INVENTION

The present application is directed to a semiconductor device using a III-nitride heterojunction and a novel gated Schottky structure suitable for high voltage circuit designs. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings.

Figure 1:
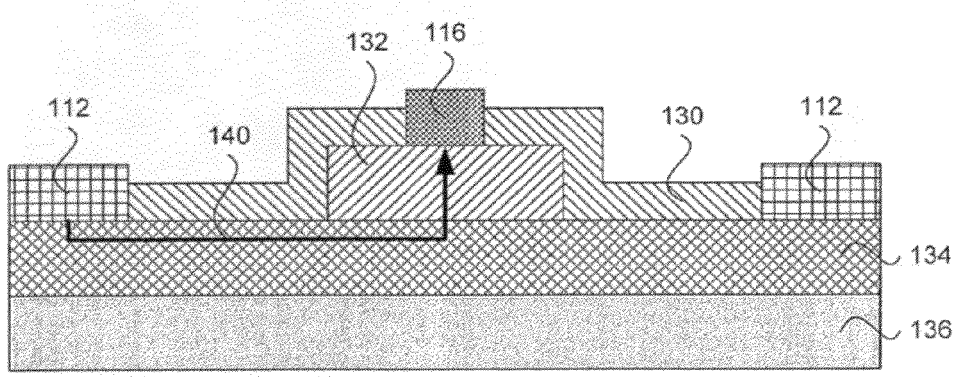
FIG. 1 illustrates a cross sectional view of a conventional GaN based Schottky structure.

FIG. 1 illustrates a cross sectional view of a conventional GaN based Schottky structure. Substrate 136 may comprise materials such as silicon, silicon carbide, or sapphire. N+ GaN layer 134 and N− GaN drift region 132 are then grown epitaxially on substrate 136. Next, anode 116 comprising a Schottky contact metal is grown on top of N− GaN drift region 132 and cathode 112 comprising an ohmic contact metal is grown on top of N+ GaN layer 134, with insulating film 130 placed between anode 116 and cathode 112. Anode 116 may comprise, for example, gold or nickel. However, in alternative embodiments, anode 116 may also include additional metal sections or a stack of metals so long as a metal section contacting N+ GaN layer 134 forms a Schottky contact. When a positive voltage is applied to anode 116 to initiate a forward bias mode, electrons travel from cathode 112 to anode 116 through N+ GaN layer 134 and N− GaN drift region 132 as shown by path 140 in FIG. 1.

While the conventional GaN based Schottky structure shown in FIG. 1 provides Schottky diode functionality, several drawbacks still exist. For example, to improve conductivity and support high voltage, N+ GaN layer 134 should be grown as thickly as possible on substrate 136. However, when using a low cost material such as silicon for substrate 136, the mismatched lattice structure and larger thermal expansion coefficient difference limits the thickness of N+ GaN layer 134. Even if thick GaN layers are achieved, a deep GaN etch is also required during process fabrication, adding additional manufacturing costs. Moreover, since the conventional GaN based Schottky structure shown in FIG. 1 does not utilize a two-dimensional electron gas (2DEG), electron mobility through N+ GaN layer 134 and N− GaN drift region 132 in path 140 is very low, with a high series resistance and an undesirably high forward voltage drop. These drawbacks render the structure shown in FIG. 1 impractical for high voltage circuit applications.

Figure 2:
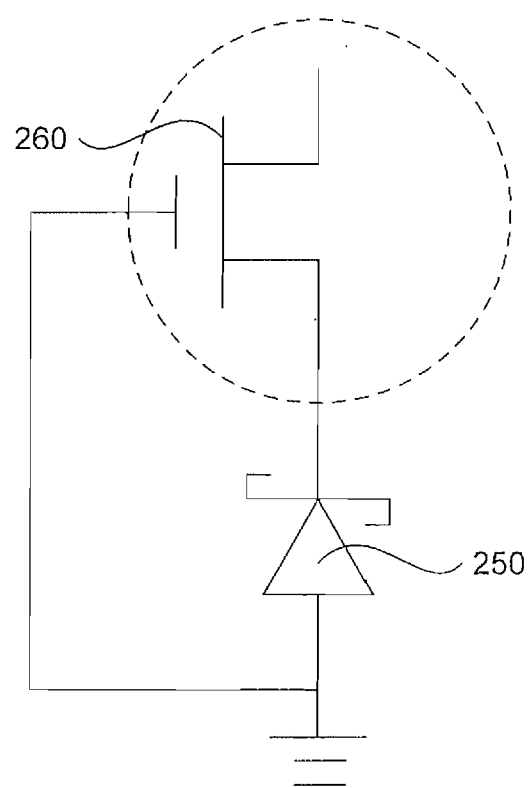
FIG. 2 illustrates a schematic diagram of a cascaded AlGaN/GaN "diode" implemented by using a Si Schottky.

FIG. 2 illustrates a schematic diagram of a cascaded AlGaN/GaN "diode" implemented using a Si Schottky. Si Schottky 250 is connected to AlGaN/GaN heterojunction field effect transistor (HFET) 260, wherein the gate of AlGaN/GaN HFET 260 is connected back to the anode of Si Schottky 250. The structure shown in FIG. 2 is able to reduce leakage current in the reverse bias mode, since after the first 5V to 30V of voltage is handled by the low voltage Si Schottky 250, AlGaN/GaN HFET 260 may continue blocking the remaining higher voltage after the cathode voltage exceeds the pinch voltage of AlGaN/GaN HFET 260. In this manner, reverse leakage current is reduced, facilitating integration into high voltage applications.

While the schematic diagram shown in FIG. 2 provides Schottky diode functionality with low reverse leakage current, drawbacks still exist. To implement the design shown in FIG. 2, Si Schottky 250 and AlGaN/GaN HFET 260 must be co-packed or integrated onto the same die. However, since relevant manufacturing processes are not yet mature, the design and fabrication of a cascaded AlGaN/GaN diode using a Si Schottky remains an expensive, cumbersome, and difficult process. Thus, from a cost and development perspective, the schematic design shown in FIG. 2 is still undesirable for integration into high voltage applications.

Figure 3:
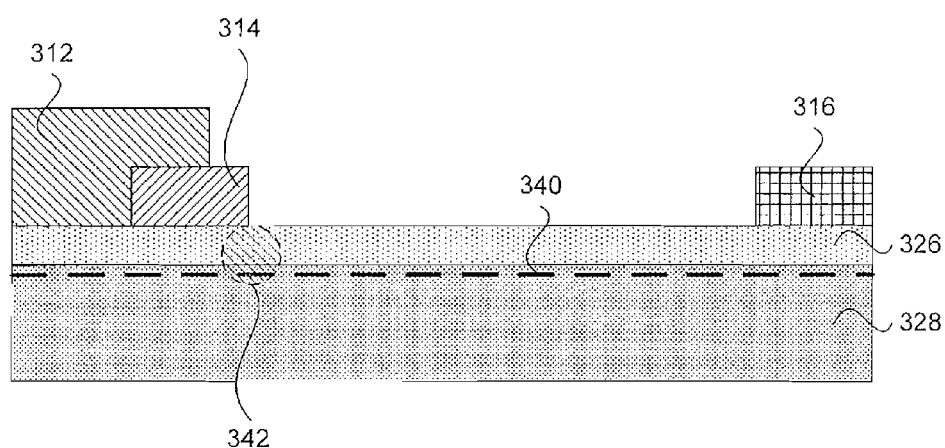
FIG. 3 illustrates a cross sectional view of a dual metal Schottky diode structure.

FIG. 3 illustrates a cross sectional view of a dual metal Schottky diode structure. GaN layer 328 and AlGaN layer 326 are formed to generate 2DEG 340 within GaN layer 328. Preferably, AlGaN layer 326 is a very thin layer, 100 nanometers or even 20 nanometers or less, to promote electron mobility in 2DEG 340. Next, anode 312 comprising a Schottky contact metal is grown on top of AlGaN layer 326 along with a high work function metal 314 having a higher work function than anode 312. As shown in FIG. 3, anode 312 and high work function metal 314 are directly shorted to each other. Cathode 316 comprising an ohmic contact metal is also grown on top of AlGaN layer 326.

When a positive voltage is applied to anode 312, current bypasses the higher work function metal 314 and passes mostly through lower work function anode 312, resulting in lower on-resistance and a lower forward voltage drop. From there, current travels through the highly mobile 2DEG 340 with low series resistance towards cathode 316.

Because of the presence of high work function metal 314, leakage in the reverse bias mode is also improved. Region 342 shown below high work function metal 314 exhibits the highest electric field, forming a depletion layer blocking the voltage in the reverse bias. Unfortunately, the net effect of high work function metal 314 is relatively minimal due to the high density of 2DEG 340 underneath thin AlGaN layer 326, which contributes to tunneling leakage as a large portion of the total Schottky leakage. Thus, the dual metal structure shown in FIG. 3 is still undesirable since leakage in the reverse bias mode remains excessively high despite the presence of high work function metal 314.

Figure 4:
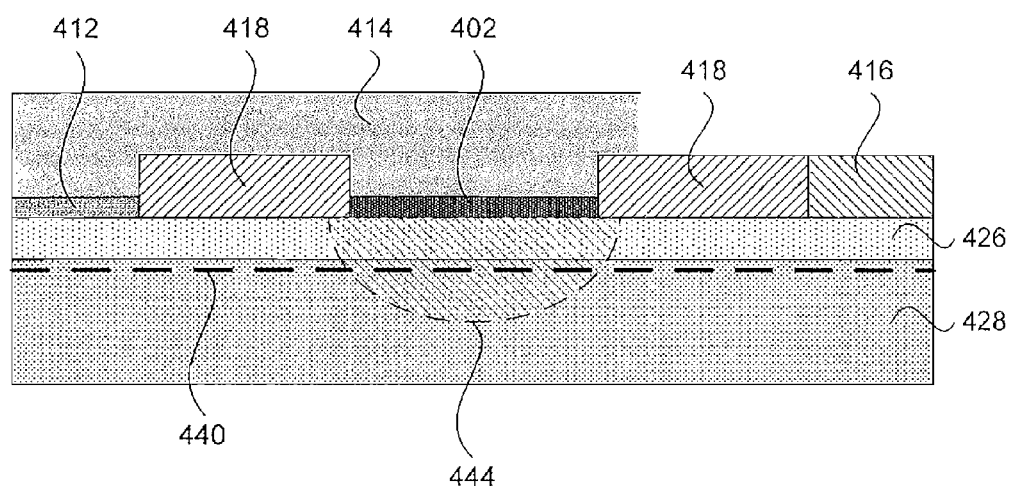
FIG. 4 illustrates a cross sectional view of a semiconductor device according to an embodiment of the invention.

FIG. 4 illustrates a cross sectional view of a semiconductor device according to an embodiment of the invention. For example, to fabricate such a semiconductor device, GaN layer 428 may first be formed. Next, AlGaN layer 426 is formed to generate 2DEG 440 within GaN layer 428, Although GaN and AlGaN are used to form 2DEG 440 in FIG. 4, alternative embodiments may use other III-nitride heterojunction materials as well.

Next, several elements are formed on the surface of AlGaN layer 426. Anode portion 412 is formed on AlGaN layer 426, comprising a Schottky contact metal such as gold or nickel. Insulating material 402 is formed on AlGaN layer 426, and may comprise materials such as silicon oxide, aluminum oxide, or silicon nitride. Anode portion 414 is formed and directly shorted on anode portion 412 to create a composite anode in contact with insulating material 402. Anode portion 414 may comprise the same Schottky contact metal as anode portion 412 and/or include other additional metal portions, which may not necessarily be Schottky contact metals. Cathode 416 comprising an ohmic contact metal is formed on AlGaN layer 426. Field dielectric layer 418 is formed on AlGaN layer 426, and may comprise several segments as shown in FIG. 4. Field dielectric layer 418 may comprise materials such as silicon nitride or silicon oxide for isolating anode portions 412 and 414 and cathode 416. As shown in FIG. 4, field dielectric layer 418 may extend above insulating material 402 and include a portion disposed between anode portion 412 and insulating material 402. Anode portion 414 may also extend above field dielectric layer 418 to make contact with insulating material 402, as shown in FIG. 4.

Similar to FIG. 3, when a positive voltage is applied to the composite anode including anode portions 412 and 414 in FIG. 4, current travels through the highly mobile 2DEG 440 with low series resistance towards cathode 416. Thus, the presence of insulating material 402 does not change the operation of the forward bias mode, and the performance of 2DEG 440 is already well suited for integration into high voltage applications.

In the reverse bias mode, the Schottky contact of anode portion 412 blocks the first low voltages, such as the first 5 to 20 volts. This is due to the self-feedback insulated gate structure of insulating material 402 contacting the composite anode, similar to the cascaded diode of FIG. 2. Afterwards, insulating material 402 between the composite anode and cathode 416 acts to pinch off 2DEG 440 after the cathode reaches the pinch voltage of insulator material 402. The particular pinch voltage of insulator material 402 depends on the thickness of insulator material 402 and the density of 2DEG 440. Since the composite anode is in contact with insulator material 402, a negative voltage applied to the composite anode is also applied to gate insulator material 402, causing a pinching off of 2DEG 440 in depletion region 444. Thus, reverse leakage current can be dramatically reduced after reaching the pinch voltage of insulator material 402, enabling efficient diode switching suitable for high voltage and high frequency circuit designs. Moreover, since the structure shown in FIG. 4 is readily fabricated using existing manufacturing processes, it is cost effective.

Figure 5:
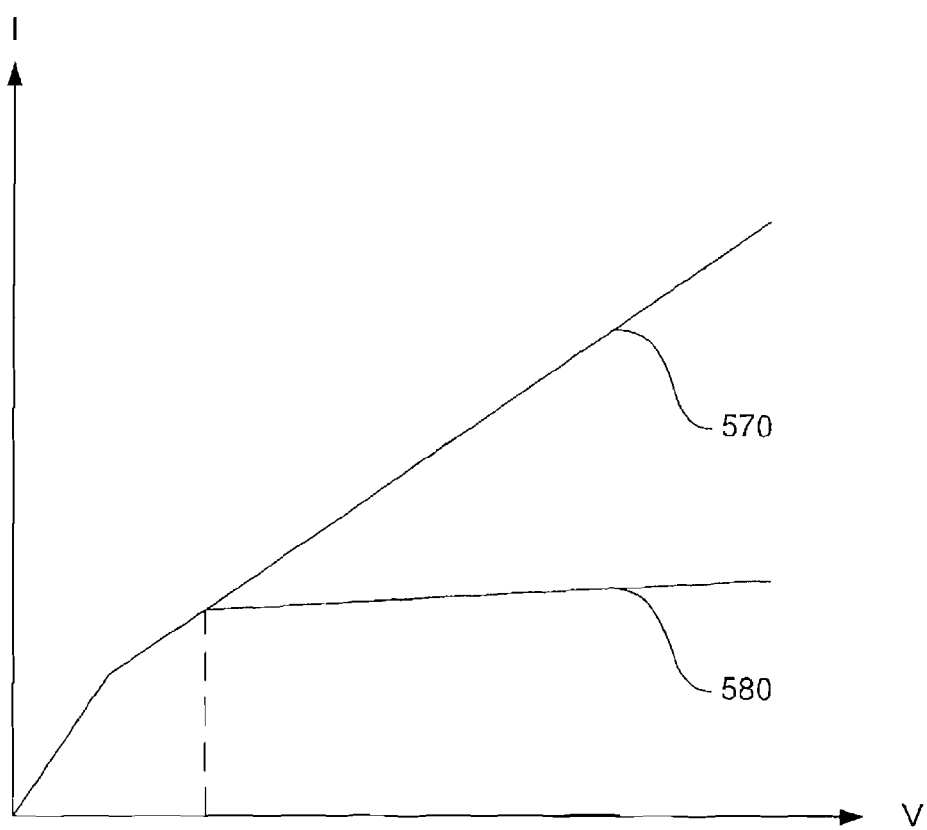
FIG. 5 illustrates an estimated current versus voltage (IV) graph comparing a standard Schottky diode to a semiconductor device according to an embodiment of the invention.

FIG. 5 illustrates an estimated current versus voltage (IV) graph comparing a standard Schottky diode to a semiconductor device according to an embodiment of the invention. Plot 570 shows the behavior of a standard Schottky diode, where reverse leakage current proceeds linearly against increasing negative voltage. On the other hand, plot 580 shows the behavior of a semiconductor device according to an embodiment of the invention, for example as described above in FIG. 4. As shown by plot 580, there is no current leakage until the pinch voltage, indicated by the dotted line, as the Schottky contact of the composite anode blocks the low voltages, as described above. Afterwards, due to the action of insulating material 402 pinching off 2DEG 440, the current leakage of plot 580 remains relatively flat, a significant improvement over the steadily increasing current leakage of plot 570.

Thus, a semiconductor device using a III-nitride heterojunction and a novel gated Schottky structure and related method resulting in such a semiconductor device have been described. Due to the electrical field action of the insulator gate material in contact with the Schottky anode, the benefits of 2DEG such as low forward voltage drop and high conductivity may be retained while advantageously achieving simplified and cost effective fabrication using existing processes, low reverse leakage current through the voltage pinching action of the insulator gate material, and high breakdown voltage through the selection of appropriate nitride-III materials such as AlGaN/GaN. These advantageous properties render the disclosed semiconductor device especially amenable for integration into efficient high voltage circuit designs.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A semiconductor device comprising:
a first layer comprising a first III-nitride material;
a second layer comprising a second III-nitride material forming a heterojunction with said first layer to generate a two dimensional electron gas (2DEG) within said first layer;
an anode comprising at least a first metal section forming a Schottky contact on a surface of said second layer, a portion of said anode disposed directly on said surface of said second layer;
a cathode forming an ohmic contact on said surface of said second layer;
an insulating material on said surface of said second layer and in contact with said anode;
a portion of a field dielectric layer that is disposed between said portion of said anode and another portion of said anode.

2. The semiconductor device of claim 1, wherein said field dielectric layer is on said surface of said second layer and is for isolating said anode and said cathode.

3. The semiconductor device of claim 2, wherein said field dielectric layer extends above said insulating material.

4. The semiconductor device of claim 2, wherein said portion of said field dielectric layer is disposed between said first metal section and said insulating material.

5. The semiconductor device of claim 2, wherein said anode extends above said field dielectric layer.

6. The semiconductor device of claim 2, wherein said field dielectric layer is selected from the group consisting of silicon nitride and silicon oxide.

7. The semiconductor device of claim 1, wherein said first III-nitride material comprises GaN.

8. The semiconductor device of claim 1, wherein said second III-nitride material comprises AlGaN.

9. The semiconductor device of claim 1, wherein said anode further comprises at least one additional metal section.

10. The semiconductor device of claim 1, wherein said insulating material is selected from the group consisting of silicon oxide, aluminum oxide, and silicon nitride.

11. The semiconductor device of claim 1, wherein said first metal section is selected from the group consisting of gold and nickel.

12. A semiconductor device comprising:
a first layer comprising a first III-nitride material;
a second layer comprising a second III-nitride material forming a heterojunction with said first layer to generate a two dimensional electron gas (2DEG) within said first layer;
an anode comprising at least a first metal section forming a Schottky contact on said second layer;
a cathode forming an ohmic contact on said second layer;
a field dielectric layer on said second layer for isolating said anode and said cathode, a portion of said field dielectric layer being disposed between a portion of said anode and another portion of said anode.

13. The semiconductor device of claim 12, wherein said portion of said field dielectric layer is disposed between said first metal section and an insulating material on said second layer.

14. The semiconductor device of claim 13, wherein said insulating material is selected from the group consisting of silicon oxide, aluminum oxide, and silicon nitride.

15. The semiconductor device of claim 12, wherein said anode extends above said field dielectric layer.

16. The semiconductor device of claim 12, wherein said first III-nitride material comprises GaN.

17. The semiconductor device of claim 12, wherein said second III-nitride material comprises AlGaN.

18. The semiconductor device of claim 12, wherein said anode further comprises at least one additional metal section.

19. The semiconductor device of claim 12, wherein said field dielectric layer is selected from the group consisting of silicon nitride and silicon oxide.

20. The semiconductor device of claim 12, wherein said first metal section is selected from the group consisting of gold and nickel.

* * * * *